United States Patent
Soeda et al.

(10) Patent No.: US 7,447,036 B2
(45) Date of Patent: Nov. 4, 2008

(54) DISK ARRAY DEVICE AND DISK ARRAY DEVICE CABLE SUPPORT METHOD

(75) Inventors: Tomonori Soeda, Oiso (JP); Shinichi Nishiyama, Ninomiya (JP); Tetsuya Abe, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 19 days.

(21) Appl. No.: 11/476,710

(22) Filed: Jun. 29, 2006

(65) Prior Publication Data

US 2006/0245168 A1 Nov. 2, 2006

Related U.S. Application Data

(63) Continuation of application No. 10/806,098, filed on Mar. 23, 2004, now Pat. No. 7,095,616.

(30) Foreign Application Priority Data

Jan. 29, 2004 (JP) .............................. 2004-020812

(51) Int. Cl.
*H05K 5/02* (2006.01)

(52) U.S. Cl. .................... 361/724; 312/223.6; 361/685; 248/68.1

(58) Field of Classification Search ................. 361/685, 361/724; 174/135; 248/68.1; 312/223.6
See application file for complete search history.

(56) References Cited

U.S. PATENT DOCUMENTS

| | | | |
|---|---|---|---|
| 2,902,821 A | 9/1959 | Kelly, Jr. | |
| 4,366,939 A | 1/1983 | McMillan | |
| 4,686,608 A | 8/1987 | Hosking | |
| 4,715,571 A | 12/1987 | Soltow et al. | |
| 5,128,855 A | 7/1992 | Hilber et al. | |
| 5,530,831 A | 6/1996 | Akiyama et al. | |
| 5,684,671 A | 11/1997 | Hobbs et al. | |
| 5,790,374 A | 8/1998 | Wong | |
| 5,819,104 A | 10/1998 | Tuccio | |
| 5,954,301 A | 9/1999 | Joseph et al. | |
| 5,958,067 A | 9/1999 | Kaneda et al. | |
| 6,061,752 A | 5/2000 | Jones et al. | |

(Continued)

FOREIGN PATENT DOCUMENTS

EP 1 094 386 A1 4/2001

(Continued)

*Primary Examiner*—Lisa Lea-Edmonds
*Assistant Examiner*—Ingrid Wright
(74) *Attorney, Agent, or Firm*—Mattingly, Stanger, Malur & Brundidge, P.C.

(57) ABSTRACT

A plurality of control packages 100 are mounted on both sides of a basic chassis 11 of a disk array device. A cable clamping mechanism 300 is disposed on the underside of the control packages 100 positioned in the space between the control packages 100 and a power unit 400. A rail portion 310 is disposed parallel to the direction in which the control packages 100 are arranged. A number of clamp cores 320 corresponding to the number of the control packages (CHA) are movably disposed on the rail portion 310. Each clamp core 320 corresponds to each of the control package 100, and clamps cables in control package units. Even when tensile force acts on the cables 200 from below, the present invention prevents this force from acting directly on a control package 100.

23 Claims, 16 Drawing Sheets

U.S. PATENT DOCUMENTS

| | | | |
|---|---|---|---|
| 6,301,605 B1 * | 10/2001 | Napolitano et al. | 709/201 |
| 6,327,139 B1 * | 12/2001 | Champion et al. | 361/608 |
| 6,406,212 B1 * | 6/2002 | Meyer | 403/170 |
| 6,445,585 B1 | 9/2002 | Walker | |
| 6,583,989 B1 | 6/2003 | Guyer et al. | |
| 6,606,253 B2 | 8/2003 | Jackson et al. | |
| 6,628,513 B1 | 9/2003 | Gallagher et al. | |
| 6,646,893 B1 | 11/2003 | Hardt et al. | |
| 6,726,164 B1 | 4/2004 | Baiza et al. | |
| 6,791,841 B1 | 9/2004 | Tirrell et al. | |
| 6,865,331 B2 * | 3/2005 | Mertesdorf | 385/135 |
| 2003/0022545 A1 | 1/2003 | Heidenreich et al. | |
| 2004/0036995 A1 | 2/2004 | Suzuki et al. | |
| 2004/0037034 A1 | 2/2004 | Suzuki et al. | |

FOREIGN PATENT DOCUMENTS

| | | |
|---|---|---|
| JP | 07-066568 | 3/1995 |
| JP | 07-319626 | 12/1995 |
| JP | 08-320768 | 12/1996 |
| JP | 09-321101 | 12/1997 |

* cited by examiner

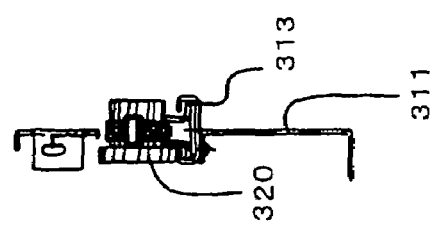
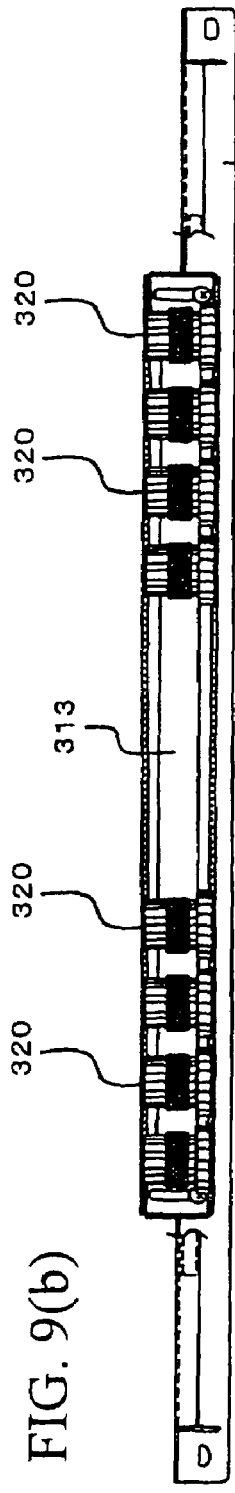
FIG. 9(b)
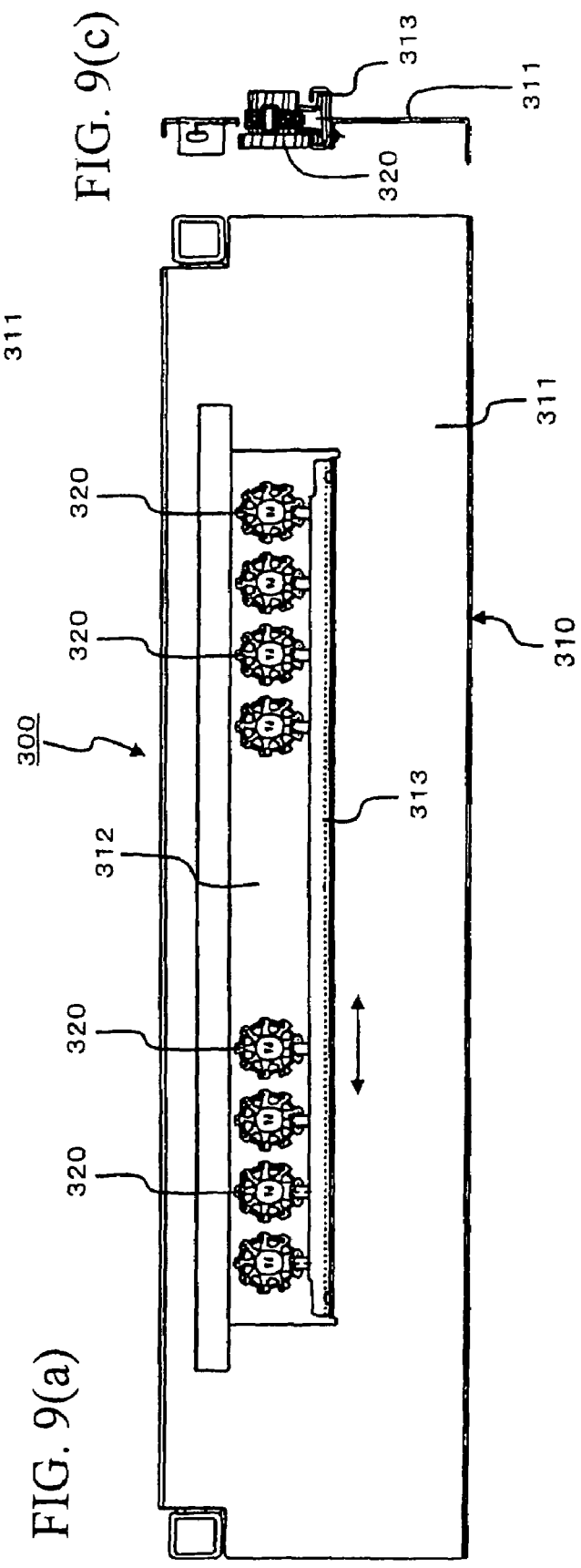
FIG. 9(a)

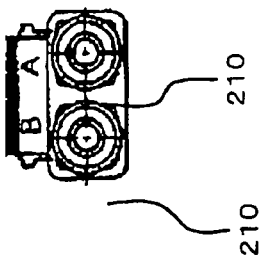
FIG.16(f)
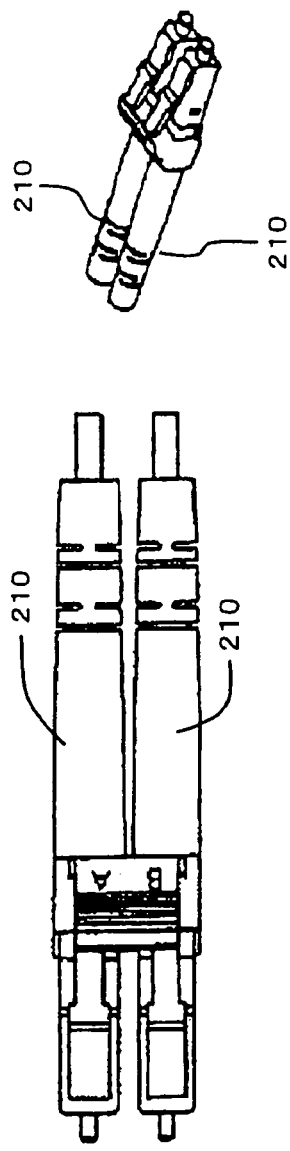
FIG.16(b) FIG.16(a)
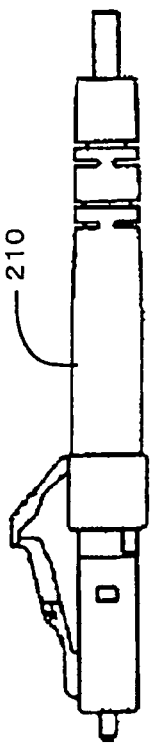 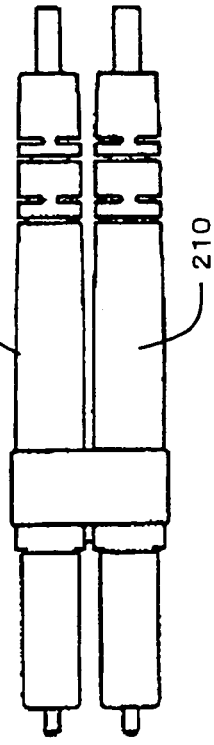
FIG.16(e) FIG.16(c)
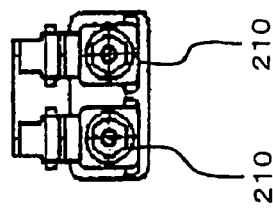
FIG.16(d)

DISK ARRAY DEVICE AND DISK ARRAY DEVICE CABLE SUPPORT METHOD

CROSS-REFERENCE TO RELATED APPLICATIONS

This application is a continuation of U.S. application Ser. No. 10/806,098, filed on Mar. 23, 2004, now U.S. Pat. No. 7,095,616, which relates to and claims priority from Japanese Patent Application No. 2004-20812 filed on Jan. 29, 2004, the entire disclosures of which are incorporated herein by reference.

BACKGROUND OF THE INVENTION

1. Field of the Invention

The present invention relates to a disk array device and a disk array device cable support method for connecting a logic board, such as, for example, a channel adapter board to an external device via cabling.

2. Description of the Related Art

A disk array device provides storage service for a host device, such as, for example, a mainframe or a server. A disk array device comprises a plurality of channel adapter boards for transferring data to and from, for example, a host device; a plurality of disk adapter boards for transferring data to and from a group of disk drives; a memory board for mounting shared memory and control memory; a power unit for supplying electrical power to these respective boards; and a battery unit as an emergency power source.

The amount of data managed by companies and municipalities is increasing year by year, and in line with this, there is demand for compact, low-priced disk array devices featuring increased capacity and enhanced reliability. As one solution for the need for such enhanced performance, methods for increasing the number of external interfaces for connecting to host devices are being considered.

For example, the number of external interfaces for a disk array device as a whole can be increased by either increasing the number of ports for a single channel adapter board, or increasing the number of channel adapter boards installed. When the number of external interfaces increases, the number of cables (for example, fiber channel cables) for connecting the external interfaces to the host device also increase.

Furthermore, although not related to the disk array device, electronic equipment wiring methods are disclosed, for example, in Japanese Patent Laid-open No. 7-66568 and Japanese Patent Laid-open No. 9-321101.

Increasing the number of ports in order to enhance performance makes the tasks of connecting and maintaining the large number of cables complicated. Also, the need to make the entire disk array device more compact is putting constraints on cabling space inside the chassis of the disk array device.

Furthermore, when a customer replaces an old disk array device with a new disk array device, the existing cables are often reused, but the locations of the ports on the old disk array device usually differ from the port locations on the new disk array device. Consequently, the user tries to forcibly pull the existing cables into position in an attempt to connect them to the new ports. However, applying unreasonable force in excess of a specified value to a cable runs the risk of the cable breaking or being otherwise damaged. The damage brought on by excess force being applied to the cable does not stop at the cable alone, but can also cause damage to the port itself. When a port is damaged, the board on which this damaged port exists must be replaced in its entirety, thereby increasing maintenance costs.

Conversely, a disk array device is a large-scale system that packages together numerous and varied replaceable functional components, such as a channel adapter board, a disk adapter board, a disk drive, a memory board, a power unit and a battery unit. Therefore, besides preventing damage to a port resulting from the cabling, the ease of maintaining the other functional components to which cables are not connected must also be taken into consideration. Thus, while there is demand to reduce the size of the entire disk array device, which comprises a large number of various types of functional components, wiring and managing large numbers of cables is no easy task.

SUMMARY OF THE INVENTION

It is an object of the present invention to provide a disk array device and a disk array device cable support method that improves reliability and maintainability.

Another object is to provide a disk array device and a disk array device cable support method for enabling a large number of cables to be reliably wired inside a limited space, and, in addition, for enabling functional components to be easily replaced.

A disk array device according to one embodiment of the present invention comprises a chassis; a plurality of logic boards, which are detachably mounted on this chassis, and which can be connected respectively to a plurality of external devices via a plurality of cables; a rail portion, which is mounted on the chassis parallel to the direction of the arrangement of these respective logic boards; and a plurality of cable supporting portions, which are movably mounted on the rail portion in accordance with the number of logic boards, and which detachably support the cables, and each of these cable supporting portions is capable of supporting the respective cables in logic board units.

For example, a channel adapter board for transferring data to and from a host device can be cited as a logic board. When data transfer is performed on the basis of a fiber channel protocol, for example, a fiber channel cable is utilized as the cable. A fiber channel cable is not limited to an optical fiber cable, but rather can also be a metal cable. As external devices, for example, a mainframe, server, personal computer, workstation and the like can be cited. Logic boards are installed inside a chassis by being lined up in a certain direction. Either one or a plurality of cables is connected to one end of each logic board. The respective logic boards are connected to external devices via the cables. Cable supporting portions are movably mounted on the rail portion, which is mounted parallel to the direction of the arrangement of the respective logic boards. Only enough cable supporting portions are mounted on accommodate the number of logic boards. Each cable supporting portion detachably supports cables for each logic board unit. That is, for example, if there are n logic boards to each of which m number of cables is connected, respectively, then n cable supporting portions will be installed. Further, each cable supporting portion supports m number of cables. For example, by using a cable supporting portion to support cables part way along their length, it is possible to reduce the impact on logic board and cable connections of forces acting on the cables, such as tensile force. Further, because the group of cables connected to each logic board is gathered together and supported by the respective cable supporting portions, the groups of cables can be easily identified. In addition, since moving the cable supporting portions makes it possible to move the groups of cables along the entire length of the cables, maintenance of the logic boards and other functional components can be performed easily.

For example, each cable supporting portion can comprise a plurality of slots capable of housing a plurality of types of cables each having different external dimensions.

For example, each cable supporting portion comprises a plurality of slots, and each of these slots can be constituted so as to be capable of housing a plurality of cables connected to the same logic board.

For example, each cable supporting portion can also be constituted comprising an approximately cylindrical main chassis; a plurality of slots mounted by circumferentially spacing them on this main body; and a mounting portion for movably mounting the main body to the rail portion.

Furthermore, each cable supporting portion can also comprise a fixing portion for fixing each cable accommodated in each of the respective slots.

Further, for example, a through-hole for the respective cables supported by each cable supporting portion to pass through is provided on the bottom of the chassis, and this through-hole can be formed so as to allow each cable to move in accordance with the movement of each cable supporting portion. In this case, the through-hole can be such that the area of the opening can be variably adjusted to correspond to the amount of cable movement.

The rail portion can be located in the vicinity of the underside of the logic boards, and can be disposed so as not to interfere with the attaching and detaching of other members.

Of the cables, the cables connected to the lowermost end of each logic board can be connected to the respective logic boards so as to support a preset predetermined allowable bending radius.

BRIEF DESCRIPTION OF THE DRAWINGS

FIG. 9 is projection views of cable clamping mechanisms;

FIG. 16 is projection views showing an example of a cable.

DESCRIPTION OF THE SPECIFIC EMBODIMENTS

An embodiment of the present invention will be explained hereinbelow referring FIG. 1 to FIG. 16. The following explanation discloses a disk array device, which comprises a chassis; a door portion, which covers the opening face in the chassis in a freely opening and closing condition; a plurality of channel adapter boards, which are detachably mounted on the approximately middle portion of the chassis in the vertical direction, and the host device connecting faces of which are positioned more on the inner side than at the opening face in the chassis; a plurality of cables, the one ends of which are connected to the connecting faces of the respective channel adapter boards, and the other ends of which are connected to the host device; at the least one or more kinds of functional components, which are positioned on the underside of each channel adapter board, and detachably mounted on the chassis; a rail portion, which is positioned on the underside more than in the mounting locations of the respective channel adapter boards so as not to interfere with the attaching and detaching of the functional components, and which is disposed on the chassis parallel to the direction in which the channel adapter boards are arranged; a plurality of cable supporting portions, which are movably disposed on the rail portion according to the number of channel adapter boards, and which detachably support the respective cables in channel adapter board units; and a through-hole which is disposed on the bottom of the chassis to allow the insertion of cables supported by the respective cable supporting portions, and which enables each cable to move in accordance with the movement of the respective cable supporting portions, and each cable supporting portion comprises an approximately cylindrical main body; a plurality of slots, which are disposed by circumferentially spacing them on this main body, and which are capable of housing either one or a plurality of a plurality of types of cables each having different external dimensions; a mounting portion for movably mounting the main body to the rail portion in a non-rotatable state; and a fixing portion for fixing the cables accommodated in the respective slots by being wrapped around the outside of the main body.

Further, in the aspects of this embodiment, there is disclosed a method for supporting the cables in a disk array device comprising a plurality of logic boards, which are detachably mounted on a chassis, and which are capable of being connected to a plurality of external devices, respectively, via a plurality of cables, and in this cable supporting method, a plurality of cable supporting portions capable of moving parallel to the direction in which the logic boards are arranged is disposed more on the underside than in the mounting locations of the logic boards, and the respective cables are detachably supported by the cable supporting portions in logic board units.

1. First Embodiment

Figure 1:
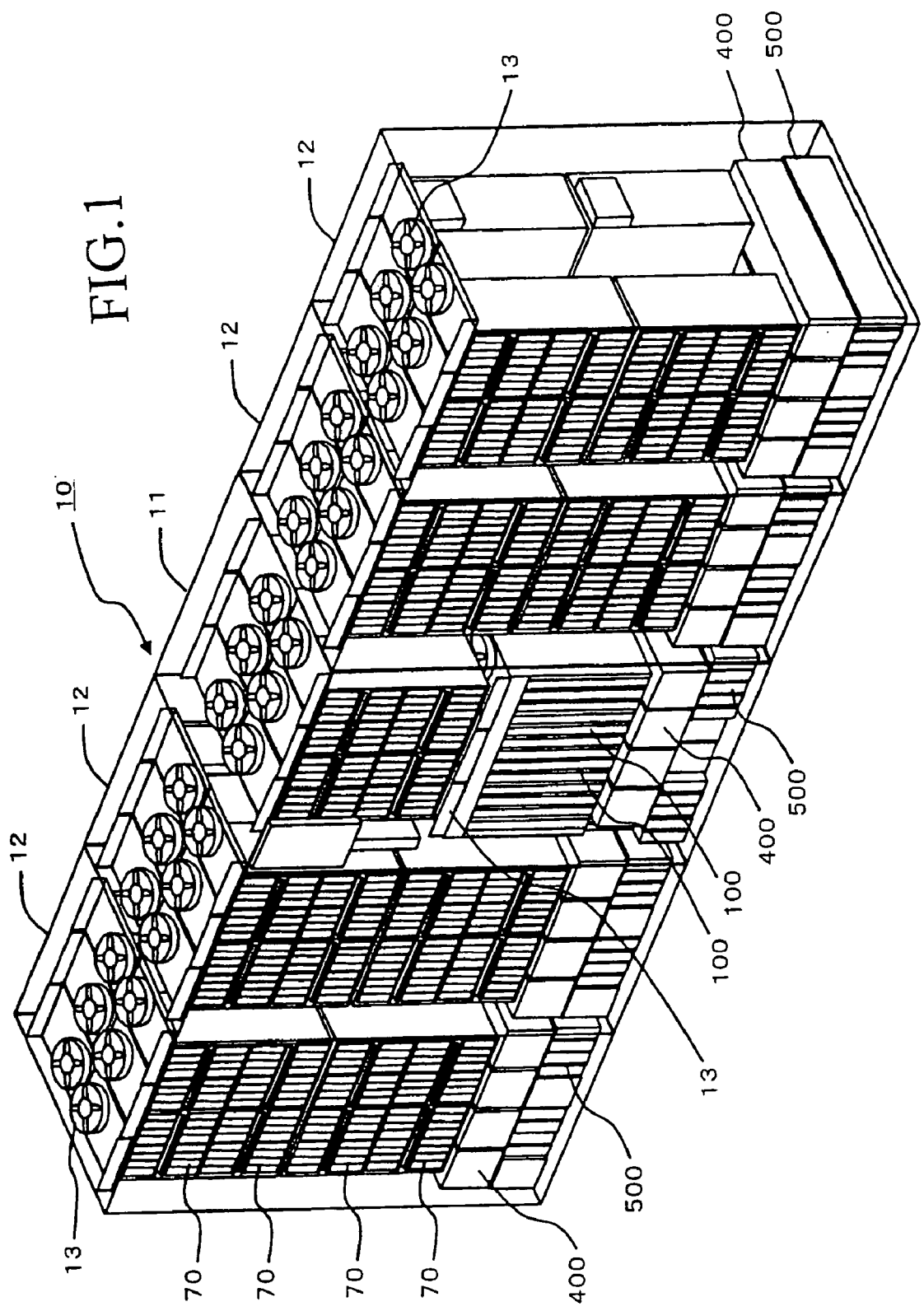
FIG. 1 is an oblique view showing the external appearance of a disk array device related to an embodiment of the present invention.

FIG. 1 is a simplified diagram showing the external appearance of a disk array device 10. The disk array device 10 can be constituted, for example, from a basic chassis 11, and a plurality of extension chassis 12. The basic chassis 11 is the smallest constituent unit of the disk array device 10, and comprises both memory functions and control functions. The extension chassis 12 are options of the disk array device 10, and are controlled via the control functions possessed by the basic chassis 11. For example, a maximum of four extension chassis 12 can be connected to a basis chassis 11.

As will be explained separately hereinbelow, a plurality of disk drives 70, a plurality of control packages 100, a plurality of power units 400, and a plurality of battery units 500, respectively, are detachably disposed on the basic chassis 11. A plurality of disk drives 70, a plurality of power units 400, and a plurality of battery units 500, respectively, are detachably disposed on the extension chassis 12. Also, a plurality of cooling fans 13 are disposed on the basic chassis 11 and each of the extension chassis 12, respectively.

Figure 2:
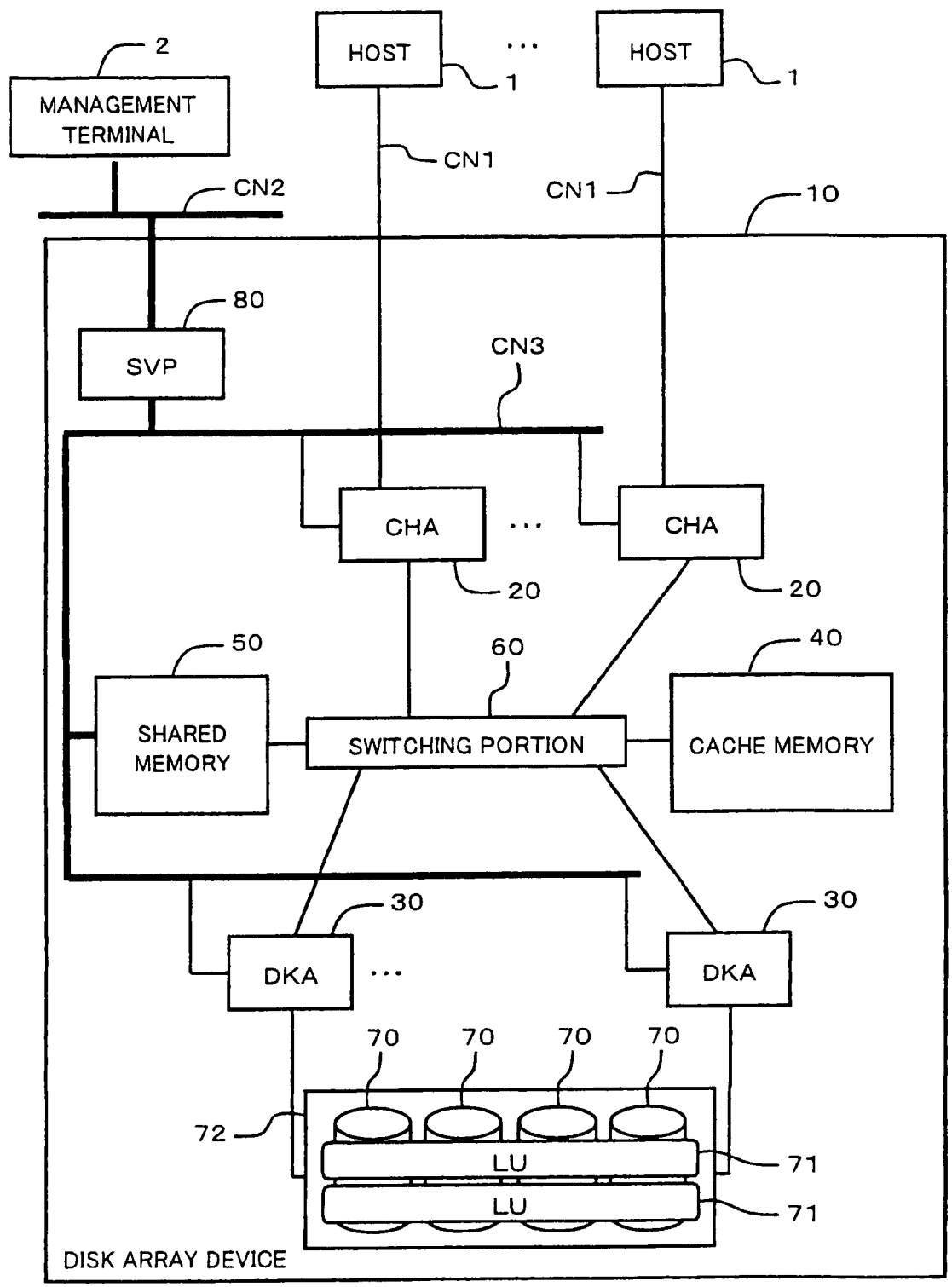
FIG. 2 is a block diagram of a disk array device.

FIG. 2 is a block diagram showing the logic configuration of a disk array device 10. The disk array device 10 is connected via communication networks CN1 to a plurality of host computers to enable two-way communications. For example, a LAN (Local Area Network), SAN (Storage Area Network), the Internet or leased lines can be utilized as the communications networks CN1 here. When using a LAN, for example, the transfer of data between a host computer 1 and the disk array device 10 is carried out in accordance with the TCP/IP (Transmission Control Protocol/Internet Protocol) protocol. When using a SAN, the transfer of data between a host computer and the disk array device 10 is performed in accordance with fiber channel protocols.

A host computer 1, for example, can be a mainframe, server, personal computer or workstation. When the host computer 1 is a mainframe, for example, data transfer is carried out in accordance with such communications protocols as FICON (Fiber Connection—a registered trademark), ESCON (Enterprise System Connection—a registered trademark), ACONARC (Advanced Connection Architecture—a registered trademark) and FIBARC (Fiber Connection Architecture—a registered trademark). Furthermore, the host computers 1 and disk array device 10 are connected via cables 200, which will be described hereinbelow, and extenders and fiber channel switches not shown in the drawings.

Each host computer 1 is connected via a separate communications network to a plurality of client terminals not shown in the figures. For example, each host computer 1 provides services to the respective client terminals by reading and writing data to the disk array device 10 in response to requests from the client terminals.

Further, a management terminal 2, for example, is connected to the disk array device 10 via a communications network CN2 such as a LAN. The management terminal 2 collects all sorts of status information from the disk array device 10 and displays it on terminal screens, and is used to set up the configuration of the disk array device 10. Furthermore, a plurality of management terminals 2 can be provided.

As will be described separately hereinbelow, the disk array device 10 comprises a plurality of channel adapters (hereinafter abbreviated as CHA) 20; a plurality of disk adapters (hereinafter abbreviated as DKA) 30; cache memory 40; shared memory 50; a switching portion 60; disk drives 70; and an SVP 80.

For example, a plurality of CHA 20 can be disposed in the disk array device 10 in groups of 4, 8 and so forth. Each CHA 20 receives commands requesting data read/writes and data from the host computer 1 to which it is connected, and operates in accordance with commands received from the host computer 1. This operation will be explained in advance inclusive of the operation of the DKA 30. For example, when a CHA 20 receives a data read request from the host computer 1, it stores a read command in shared memory 50. The DKA 30 is constantly referencing shared memory 50, and when it detects an unprocessed read command, it reads out the data from a disk drive 70 and stores it in cache memory 40. The CHA 20 reads out the data that has been moved to cache memory 40 and sends it to the host computer 1 that originally issued the command.

Further, when a CHA 20 receives a data write command from a host computer 1, it stores the write command in shared memory 50, and, in addition, stores the received data (user data) in cache memory 40. After storing the data in cache memory 40, the CHA 20 notifies the host computer 1 that the write has been completed. Then, the DKA 30 reads out the data stored in cache memory 40 in accordance with the write command stored in shared memory 50, and stores it in the prescribed disk drive 70.

For example, a plurality of DKA 30 can be disposed in a disk array device 10 in groups of 4, 8 and so forth. The DKA 30 controls data communications between the respective disk drives 70. For example, the DKA 30 and disk drives 70 are connected via a communications network such as a SAN, and data transfers are carried out in block units in accordance with the fiber channel protocol.

The respective DKA 30 constantly monitor the status of the disk drives 70, and the results of this monitoring are sent to the SVP 80 via an internal communications network CN3. Furthermore, each CHA 20 and DKA 30, respectively, for example, comprises a printed circuit board mounted with processors and memory and control programs that are stored in memory, and achieve their prescribed functionality by virtue of the collaborative operations of these hardware and software components. The constitution of the CHA 20 package will be explained further hereinbelow.

Cache memory 40, for example, stores user data and the like. Cache memory 40, for example, is constituted from non-volatile memory. Cache memory 40 can be constituted from a plurality of memories, and can perform multiple management for user data.

Shared memory (or control memory) 50, for example, is constituted from non-volatile memory. For example, control information and the like is stored in shared memory 50. Furthermore, information such as control information can be multiply managed by a plurality of shared memory 50. A plurality of shared memory 50 and cache memory 40, respectively, can be provided.

The switching portion 60 mutually connects the respective CHA 20, DKA 30, cache memory 40 and shared memory 50. This makes it possible for all CHA 20 and DKA 30 to access cache memory 40 and shared memory 50, respectively.

The SVP (Service Processor) 80 gathers information from the respective CHA 20 and DKA 30 via an internal LAN or other such communications network CN3. For example, device configuration, power alarm, temperature alarm, and input-output rate (IOPS) and so forth can be cited as information gathered by the SVP 80. The SVP 80 is connected to the management terminal 2 via a communications network CN2.

The disk array device 10 comprises a plurality of disk drives 70. Each disk drive 70, for example, can be constituted from a hard disk device or semiconductor memory device or the like. Then, for example, a single RAID group 72 can be constituted from four or another predetermined number of disk drives 70. A logical volume (or (Logical Unit) or logical device (LDEV)), which is a logical storage area, can be set up on the physical storage area provided by this RAID group 72.

Figure 3:
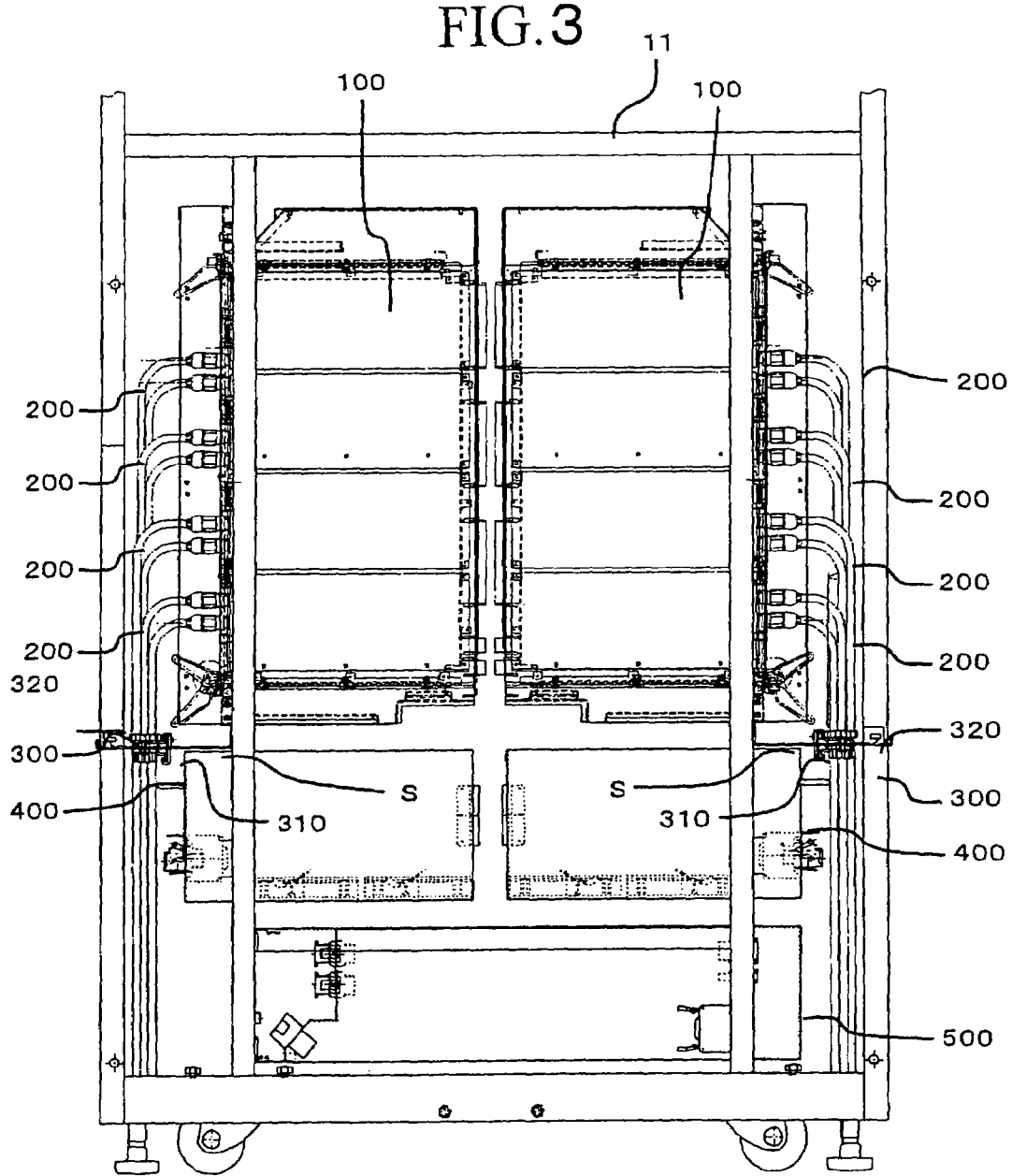
FIG. 3 is a schematic diagram showing a portion of a disk array device seen from the side.

FIG. 3 is a cross-sectional view showing a portion of a basic chassis 11. In order from the top down, disk drives 70 (shown in FIG. 1), control packages 100, power units 400, and battery units 500 are mounted on the basic chassis 11. In FIG. 3, the constitution below the control packages 100 of a basic chassis 11 is partially shown.

For example, control packages 100 as "logic boards" are detachably mounted from the one face and from the other face of the basic chassis 11, respectively. The group of control packages mounted from the one face and the group of control packages mounted from the other face are attached so as to face each other. Furthermore, each group of control packages, respectively, is connected to a backboard (not shown in the figure).

The control packages 100 each achieve their predetermined functionality. That is, the CHA 20, DKA 30, cache memory 40, and shared memory 50 described together with FIG. 2, for example, are each constituted as separate control packages 100, like a CHA package, a DKA package, and a memory package. Furthermore, cache memory 40 and shared memory 50 can be respectively constituted as separate control packages, or cache memory 40 and shared memory 50 can be mounted inside a single control package.

Cables 200 are connected to the CHA package, which is the control package 100 that achieve CHA 20. In the following explanation, the explanation will focus on the control package 100 that achieves CHA 20. The front face of each control package 100 (either the front side in the direction in which the control package 100 is inserted into the chassis, or the backboard connection side) is connected to the backboard, and eight sets of cables 200, each set of which comprises a pair of cables, are connected to the rear face of each control package 100 (either the rear side in the direction in which the control package 100 is inserted into the chassis, or the cable connection side). The eight cables 200 shown in FIG. 3 are each constituted from two cables.

A plurality of power units 400 are detachably mounted below the respective control packages 100, and a plurality of battery units 500 are detachably mounted below the respective power units 400. And in the space between the lower end of the control packages 100 and the upper end of the power units 400, there are mounted cable clamping mechanisms 300 on both the one face and the other face of the basic chassis 11. That is, independent cable clamping mechanisms 300 are provided for each group of opposing control packages. The cable clamping mechanisms 300 will be explained in further detail hereinbelow.

Figure 4:
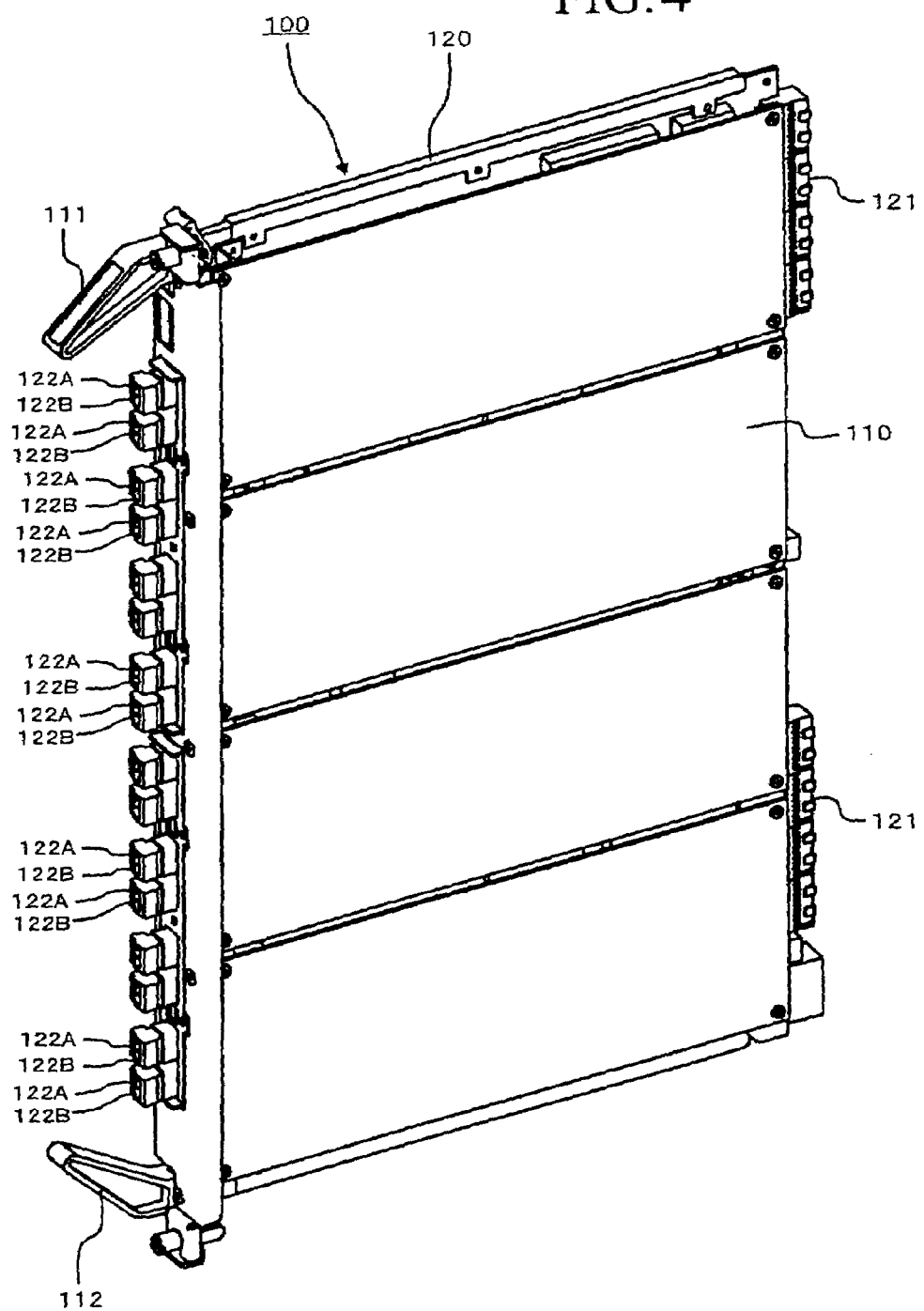
FIG. 4 is an enlarged external view showing a control package.

Next, a control package 100 and cables 200 will be explained by referring to FIG. 4 and FIG. 5. FIG. 4 is an oblique view showing an enlarged control package 100. A control package 100 can be broadly divided into a package 110 and a control board 120 that is disposed inside this package 110. The package 110 protects the control board 120, and levers 111, 112 are disposed in a rotatable condition at both the upper and lower ends of the rear face of the package 110.

The control board 120, for example, is constituted by mounting a microprocessor, control and logic circuits, and local memory (none of which are shown in the figure) to a printed circuit board. On the front face of the control board 120, there are disposed connectors 121 for connecting to the connectors on the backboard (not shown in the figure). Further, on the rear face of the control board 120, there are disposed connectors 122A, 122B for connecting to the cables 200. Here, connectors 122A and connectors 122B form pairs. Therefore, in the example shown in the figure, a total of sixteen pairs of connectors, each pair comprising a connector 122A and a connector 122B, are provided. Consequently, the total number of connectors comes to thirty-two. In the explanations that follow, unless a distinction is specifically made, individual connectors will be referred to as connector 122.

Figure 5:
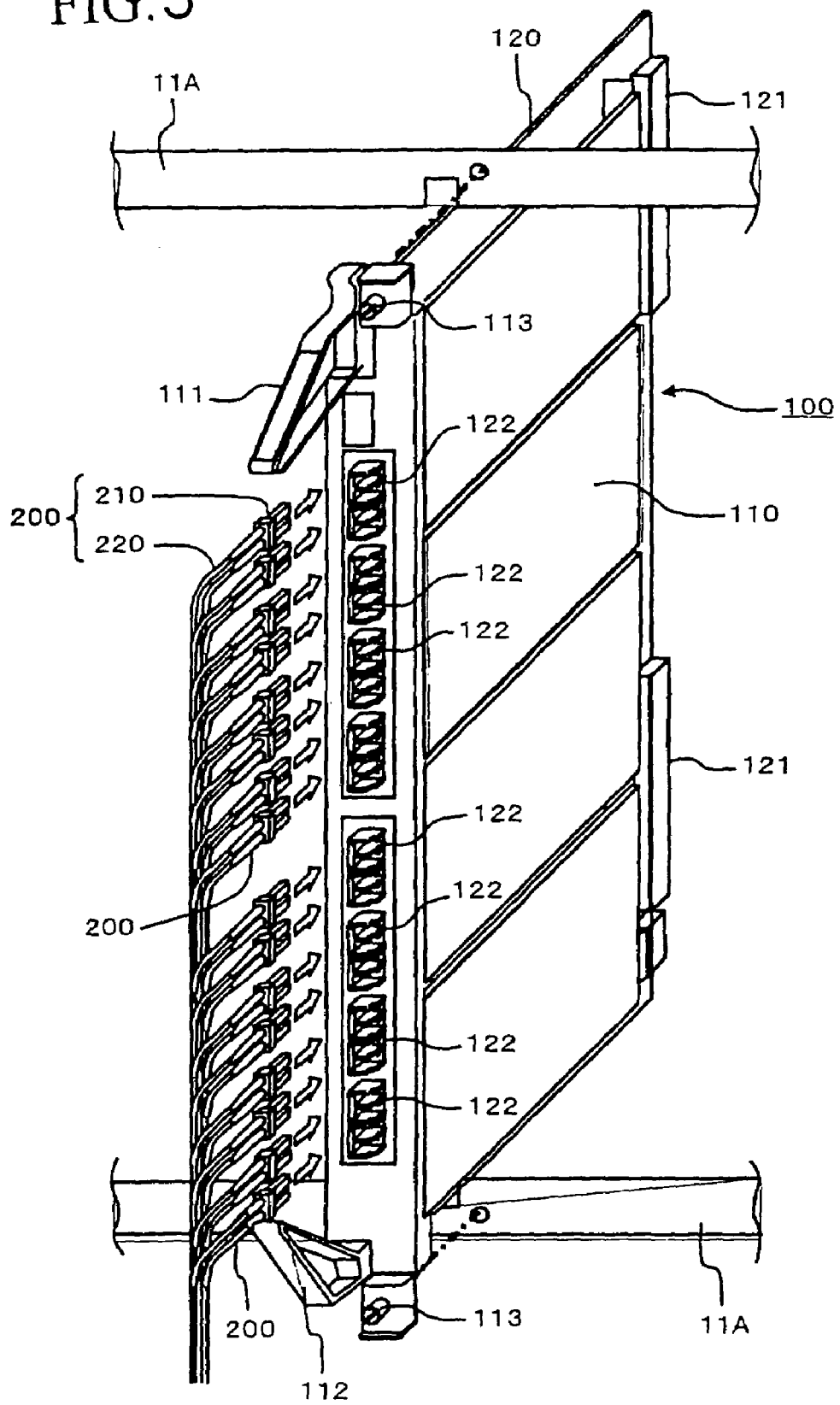
FIG. 5 is an external view showing a state wherein groups of cables are connected to the control package.

Next, FIG. 5 is an oblique view showing a state wherein cables 200 are attached to a control package 100. Both the upper and lower ends of the control package 100 are attached to chassis 11A of the basic chassis 11 via screws 113. Cables 200 are detachably connected to the control package 100 connectors 122, respectively. The cables 200 will be explained in more detail hereinbelow, but each cable 200 comprises a connector 210 and a cable body 220.

Figure 6:
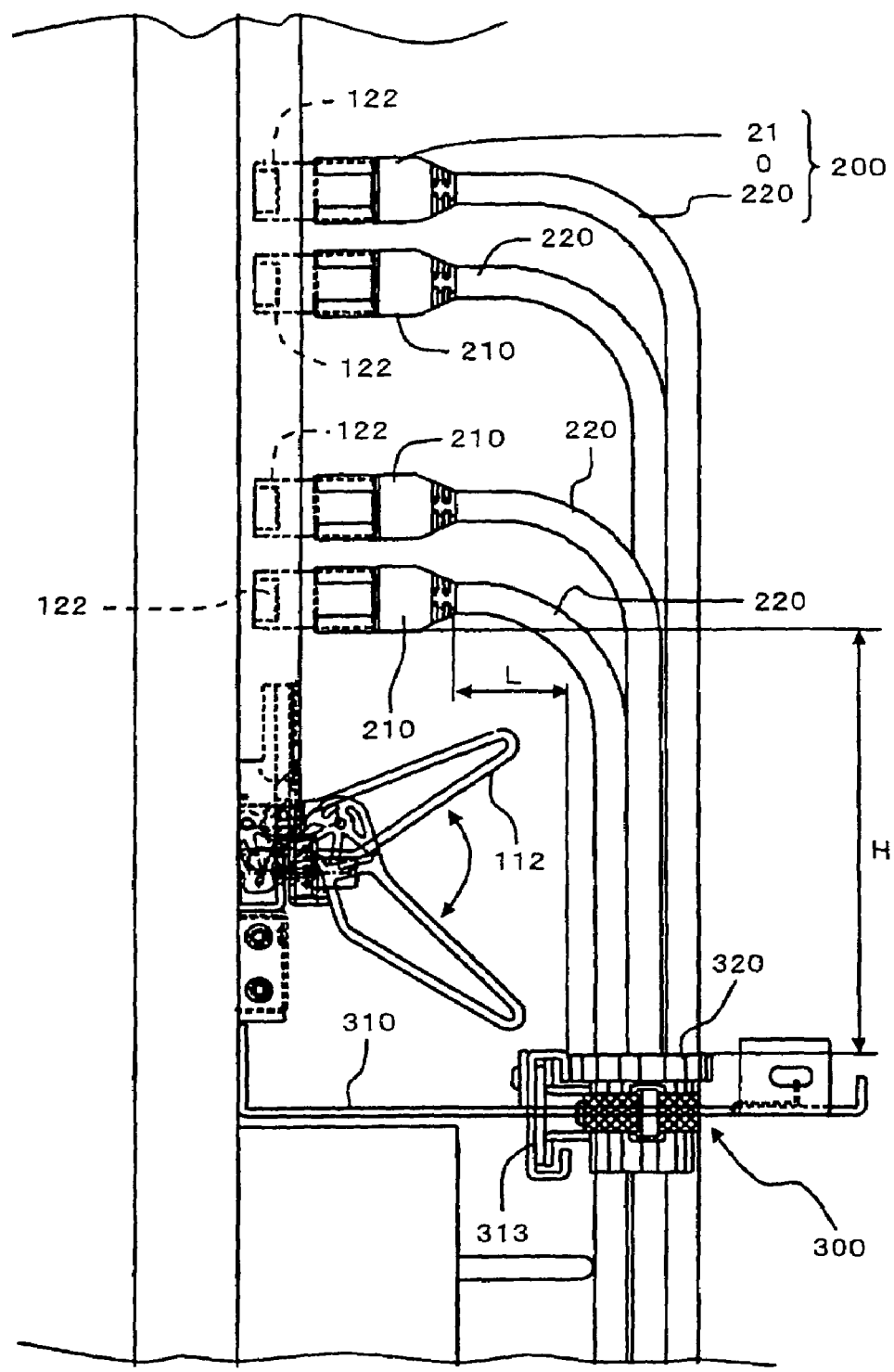
FIG. 6 is a schematic diagram showing an enlarged view of control package and cable connections.

FIG. 6 is a schematic diagram showing an enlarged view of the connection state between cables 200 and a control package 100. In FIG. 6, an enlarged view of cables 200 connected to the underside of a control package 100 is shown. The connector 210 of a cable 200 mates with a connector 122 of the control package 100, and the cable body 220 extends horizontally for a short distance from the connector 210, and hangs down. That is, the cable 200 is hanging down toward the bottom portion of the basic chassis 11 from the rear face of the control package 100, doing away with useless slack in the cable. For example, it is also possible to guide a cable 200 to the front face of the control package 100, pass it through a space in the center portion of the basic chassis 11 and lower it down, but since the length of the cable becomes long in this case, impedance is apt to increase. By contrast, in this embodiment, since the cables 200 are made to hang down directly from the rear face of the control package without being guided to the inside of the basic chassis 11, the length of the cables can be made shorter and impedance can be reduced, making it possible to prevent signal degradation by lessening the effects of noise and the like.

Part way along the cables 200, the cables 200 are clamped by a cable clamping mechanism 300. More specifically, a cable clamping mechanism 300 is mounted such that each cable 200 can be clamped as close to the control package 100 as possible. If a cable clamping mechanism were to be disposed such that it overlapped with the rear face of the control package 100, it would not be possible to replace the control package 100 without removing the cable clamping mechanism 300 from the basic chassis 11. Accordingly, a cable clamping mechanism 300 is disposed in a location that is as close to the control package 100 as possible so as not to impede the work of replacing the control package 100, or power unit 400 or the like; in other words, in a location that will not interfere with the replacement of the respective functional components.

Pay attention here to the cables 200 that are connected to the lowermost portion of the control package 100. The radius of curvature of the cables 200 connected to the lowermost portion is liable to become smaller. Accordingly, in this embodiment, the respective cables 200 are connected such that even the cables 200 connected to the lowermost portion of the control package 100 are able to maintain a predetermined allowable curvature radius L (for example, L is roughly 30 mm or more). Furthermore, for cables 200 that are connected to the lowermost portion of the control package 100, the spacing dimension H from the uppermost portion of the cable clamping mechanism 300 to the lower end of the connector 210 of the cable 200 is set at slightly less than four times the allowable bending radius L (for example, H=roughly 118 mm). In other words, the relationship between dimension L and dimension H is set so that the cables 200 connected to the lowermost portion of the control package 100 can achieve the predetermined allowable bending radius.

Figure 7:
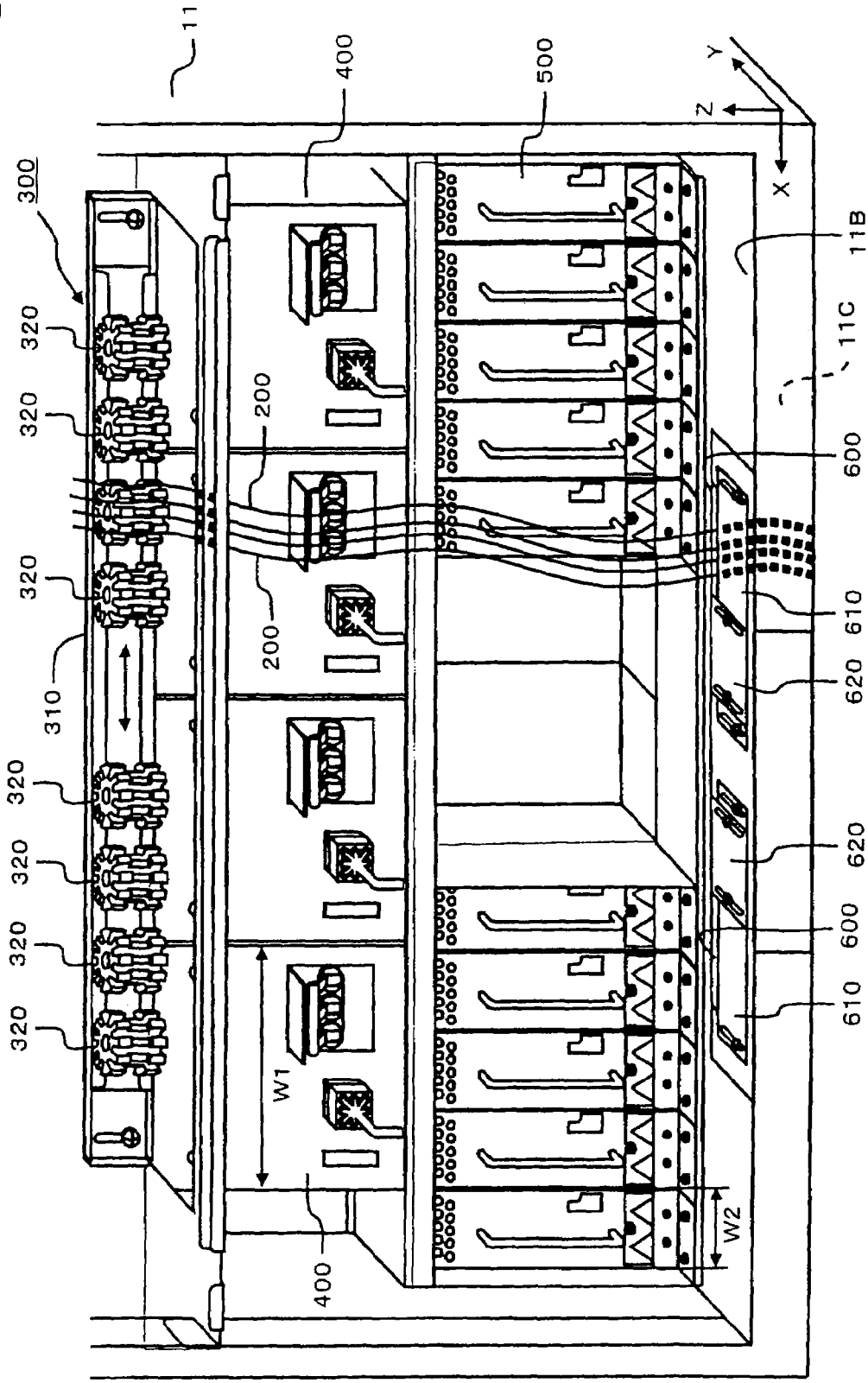
FIG. 7 is an enlarged oblique view showing a portion of the body of a board.

Next, the cable clamping mechanisms 300 will be explained in detail. As already described, the cable clamping mechanisms 300 are positioned between the lower end of a control package 100 and the upper end of a power unit 400, and are disposed so as to horizontally transverse the one face and the other face of the basic chassis 11. As shown in FIG. 7, a cable clamping mechanism 300 is approximately constituted from a rail portion 310; a plurality of clamp cores 320 attached to the rail portion 310; and fixing bands 330. FIG. 7 is an enlarged partial oblique view showing the lower end of the basic chassis 11 with a portion of the battery unit 500 removed for the sake of explanation.

The rail portion 310 is disposed by being positioned between the respective control packages 100 and respective power units 400 so as not to interfere with the replacement of the control packages 100 and power units 400. The rail portion 310 is formed by extending it in the direction in which the control packages 100 are arranged (the horizontal direction, left-right direction in FIG. 7). In the rail portion 310, number of clamp cores 320 corresponding to the number of mounted control packages 100 to which cables 200 are connected is movably disposed in the direction in which the respective control packages 100 are arranged. Furthermore, the rail portion 310 can also be divided in the direction in which the respective control packages 100 are arranged, and clamp cores 320 can be movably disposed on each rail portion 310, respectively. Further, the number m of control packages to which a plurality of cables 200 are connected, and the number n of clamp cores 320, do not necessarily have to coincide, but preferably should satisfy the relationship of m≦n.

Here, the range of movement CL of each clamp core 320 (See FIG. 8), for example, is set such that a power unit 400 or battery unit 500 can be attached or detached without removing the cables 200 from either all or a portion of the control packages 100. More specifically, for example, if it is supposed that the width of a power unit 400 (the dimension in the horizontal direction X in FIG. 7) W1 is greater than the width of a battery unit W2 (W1>W2), the range of travel CL of the respective clamp cores 320 can be set to around one half of W1(CL=W1/2). That is, for example, of the replaceable functional components (400, 500) positioned below a control package 100, there is a functional component (400) whose dimensions (W1, W2) along the direction of movement of the clamp cores 320 is the greatest. A clamp core 320 can be capable of moving more than one-half this greatest dimension W1. This makes it possible to replace a power unit 400 or battery unit 500 located on the underside of a control package 100 without removing the cables 200 from the control package 100.

Furthermore, the above is an example, but the present invention is not limited to this. The movable range CL of a clamp core 320 is determined by the mounting locations of the clamp cores 320, the mounting locations and width dimensions of the various functional components positioned on the underside of a control package 100, and the amount of play in the cables 200. For example, depending on the slack (play) in a cable 200 in the portion below a clamp core 320, a power unit 400 or the like can be replaced by causing the cable 200 to bend slightly after moving the clamp core 320 in either direction horizontally. Further, the above-mentioned scenario is premised on the respective cables 200 being connected to all adjacent control packages 100, but when a CHA package to which cables 200 are connected and a DKA package to which cables 200 are not connected are mounted in a mixed condition, since the groups of cables are not in proximity, the movable range CL of the respective groups of cables can be increased.

A cable through-hole 600 is disposed in the bottom of the basic chassis 11 so as to be facing the cable clamping mechanism 300. The cable through-hole 600 is formed in an elongated hole shape that extends in the direction in which the rail portion 310 is laid out (X direction). The overall length of the cable through-hole 600 can correspond to the overall length of the rail portion 310, but the two do not necessarily coincide. The cable through-hole 600 is provided to allow cables 200 hanging down in the Z direction from the respective clamp cores 320 to pass into the space in the bottom portion of the basic chassis 11. Preferably, the cable through-hole 600 is formed long enough to encompass the positions in which the clamp cores 320 are arranged such that the cables 200 hanging down from the respective clamp cores 320 pass through the cable through-hole 600 in an approximately perpendicular condition. However, the length of the cable through-hole 600 in the longitudinal direction can be set so as to be slightly shorter than the length of the clamp core 320 arrangement (a length that is practically equivalent to or less than the length of the rail portion 310). Further, there does not have to be just a single cable through-hole 600; a plurality of cable through-holes 600 can also be provided so as to correspond to one or a plurality of clamp cores 320. In the example of FIG. 7, a plurality of cable through-holes 600 are provided.

A cable through-hole 600, for example, is covered by two types of covers. The first cover 610 is for regulating the position of the cables 200 in the Y direction (the depth direction of the basic chassis 11). The second cover 620 is for regulating the position of the cables 200 in the X direction. By virtue of the covers 610, 620, it is possible to gently regulate the pass-through positions of the cables 200 passing through to the bottom portion of the basic chassis 11. Furthermore, the groups of cables that pass through the cable through-hole 600, for example, are connected to a host device or to a device (a fiber channel switch or the like) for connecting to a host device either above or below the floor on which the basic chassis 11 is installed.

Figure 8:
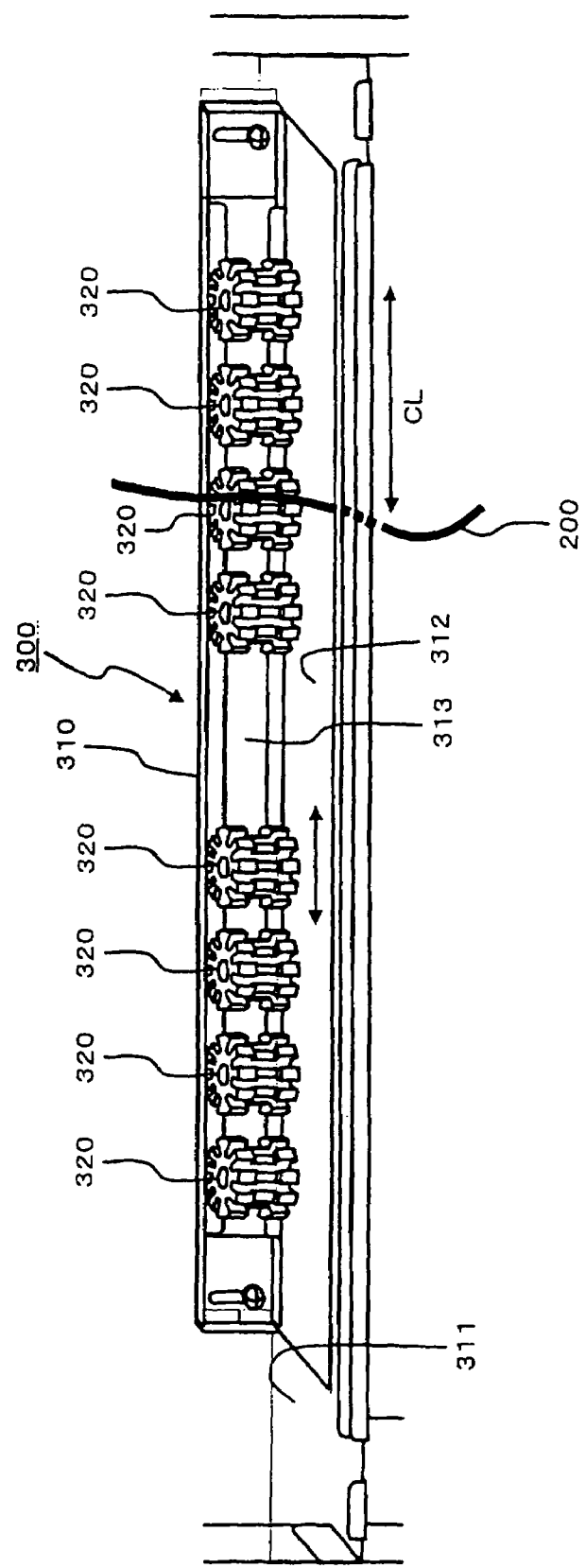
FIG. 8 is an oblique view showing an enlarged cable clamping mechanism.

FIG. 8 is a schematic diagram showing an enlarged view of a cable clamping mechanism 300. FIG. 9 is projection views of a cable clamping mechanism 300. The rail portion 310, for example, can be constituted from an approximately rectangular flat plate 311; an open portion 312 formed approximately in the center of the flat plate 311; and a rail main body 313 orthogonally disposed along the open portion 312.

Figure 10C:
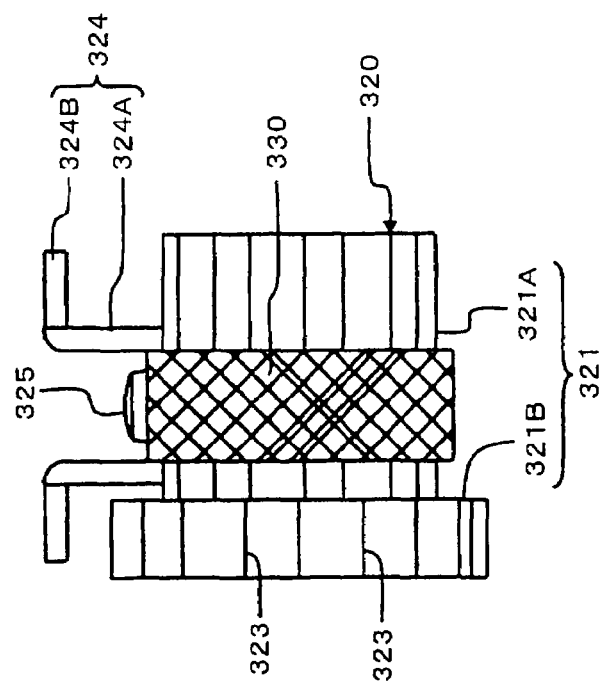
FIG. 10 is projection views showing an enlarged clamp core.
Figure 10B:
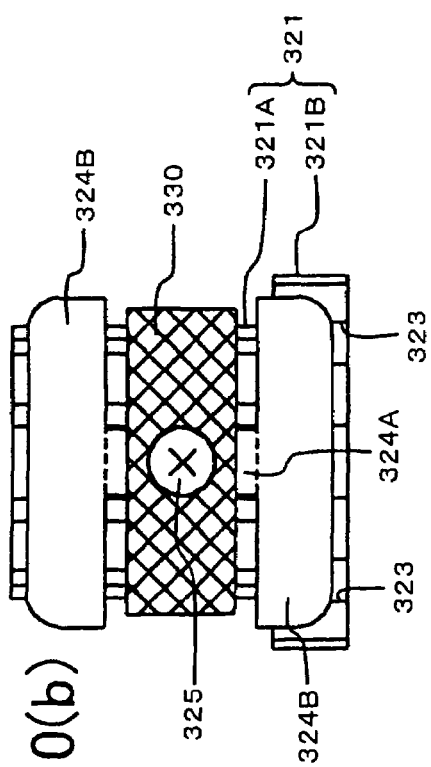
Figure 10A:
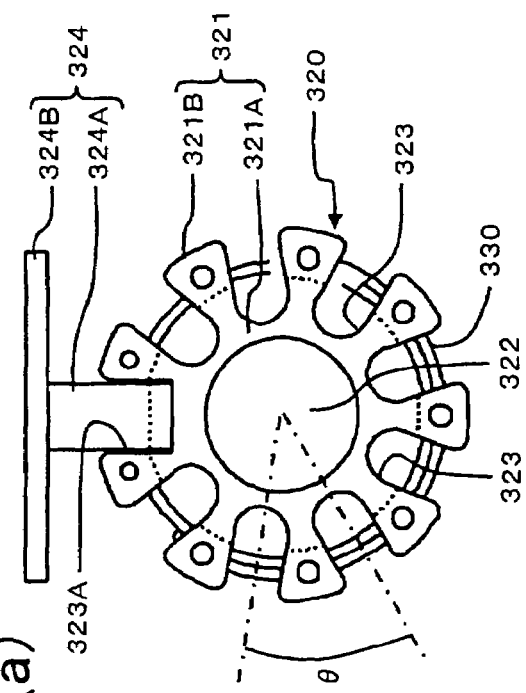

FIG. 10 is enlarged projection views showing a clamp core 320. A clamp core 320, for example, can be constituted from an approximately cylindrical core main body 321; a convex portion 322 axially disposed in the core main body 321; slots 323 disposed at a predetermined spacing around the periphery of the core main body 321; and a mounting portion 324 for mounting the core main body 321 to the rail main body 313 of the rail portion 310 in a movable condition.

Figure 11:
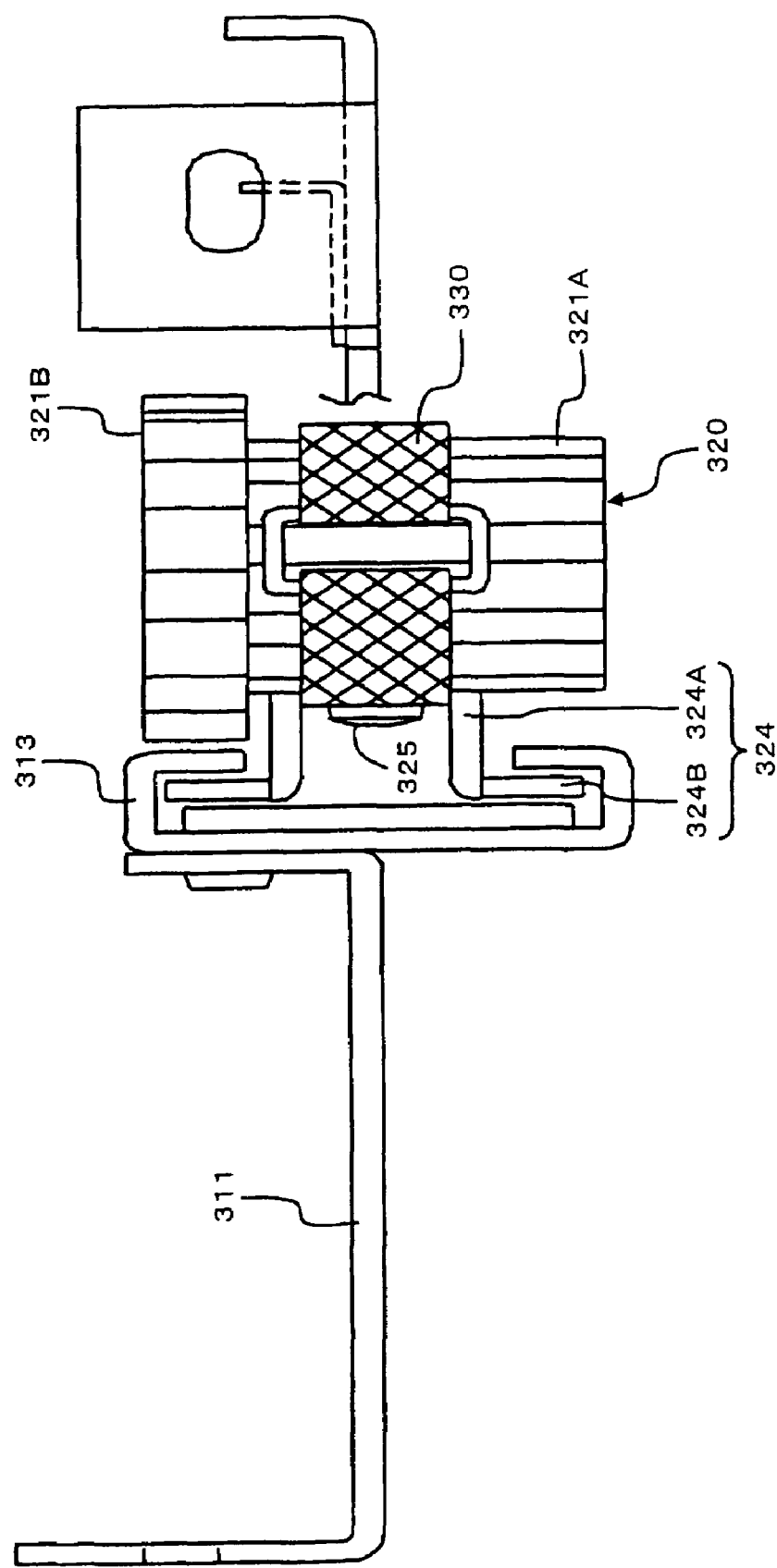
FIG. 11 is a schematic diagram showing the state of a connection between a clamp core and a rail portion.

The core main body 321 is constituted from a shank portion 321A located toward the shaft center, and a large-diameter portion 321B located on the outer side of the shank portion 321A. Then, a convex portion 322 is formed on the inner side of the shank portion 321A. Furthermore, the convex portion 322 can also be a through-hole. Further, the large-diameter portion 321B can be disposed at either the top and bottom or at one of the top or bottom of the shank portion 321A. FIG. 7, FIG. 8, FIG. 12 and FIG. 13 show instances when large-diameter portions 321B are disposed at both the top and bottom of the shank portion 321A, respectively, and FIG. 9 through FIG. 11 show instances when a large-diameter portion 321B is disposed only at the top end of the shank portion 321A.

The slots 323 are disposed so as to face toward the shaft center from the large-diameter 321B of the core main body 321, and are formed as approximately cross-sectional U-shaped grooves. Slots 323 are provided in accordance with the number of cables 200 connected to a single control package. A plurality of cables 200 (in this embodiment, two cables) can pass though each slot 323. Cables 200 can be radially attached to the respective slots 323. For example, if the cable 200 is a wide-diameter 1 Gb/s fiber channel cable, a single cable can pass through each slot 323, and if the cable 200 is a 2 Gb/s fiber channel cable with a relatively narrower diameter than the 1 Gb/s cable, then two cables can pass through each slot 323. That is, the cross-sectional shape of the respective slots 323 is set such that one or a plurality of cables of a plurality of types having different diameters can pass through. Furthermore, when cables 200 of a plurality of types having different diameters are connected to a single control package 100, slots having different cross-sectional shapes can co-exist in a single clamp core 320. Further, the present invention can also be constituted so that cables 200 are inserted by forming the core main body 321 from a material having some flexibility, such as a resin material or a metallic material, and warping the slots 323.

One clamp core 320 corresponds to one control package to which cables 200 are connected. Consequently, the number of clamp cores provided is proportional to the number of control packages to which respective groups of cables are connected, and enough slots 323 are provided to enable the accommodation of all the cables 200 attached to a single control package 100. In this embodiment, two narrow-diameter cables pass through one slot 323 at a time. When a total of eight pairs of cables 200 are connected to a control package 100, a total of eight slots 323 are disposed in a clamp core 320. Further, in addition to this, a slot 323A for attaching a mounting portion 324 can also be provided. Therefore, a total of nine slots 323, 323A are disposed at intervals in a clamp core 320. The angle θ between the respective slots 323, 323A is 40 degrees.

The mounting portion 324 can be constituted from a fixing portion 324A which is fixed to the mounting slot 323A using a screw 325, and plate-shaped protruding portions 324B, which extend vertically (in the Z direction in FIG. 7) from the fixing portion 324A. As shown in FIG. 11, each protruding portion 324B slidably mates to the rail main body 313.

Figure 12:
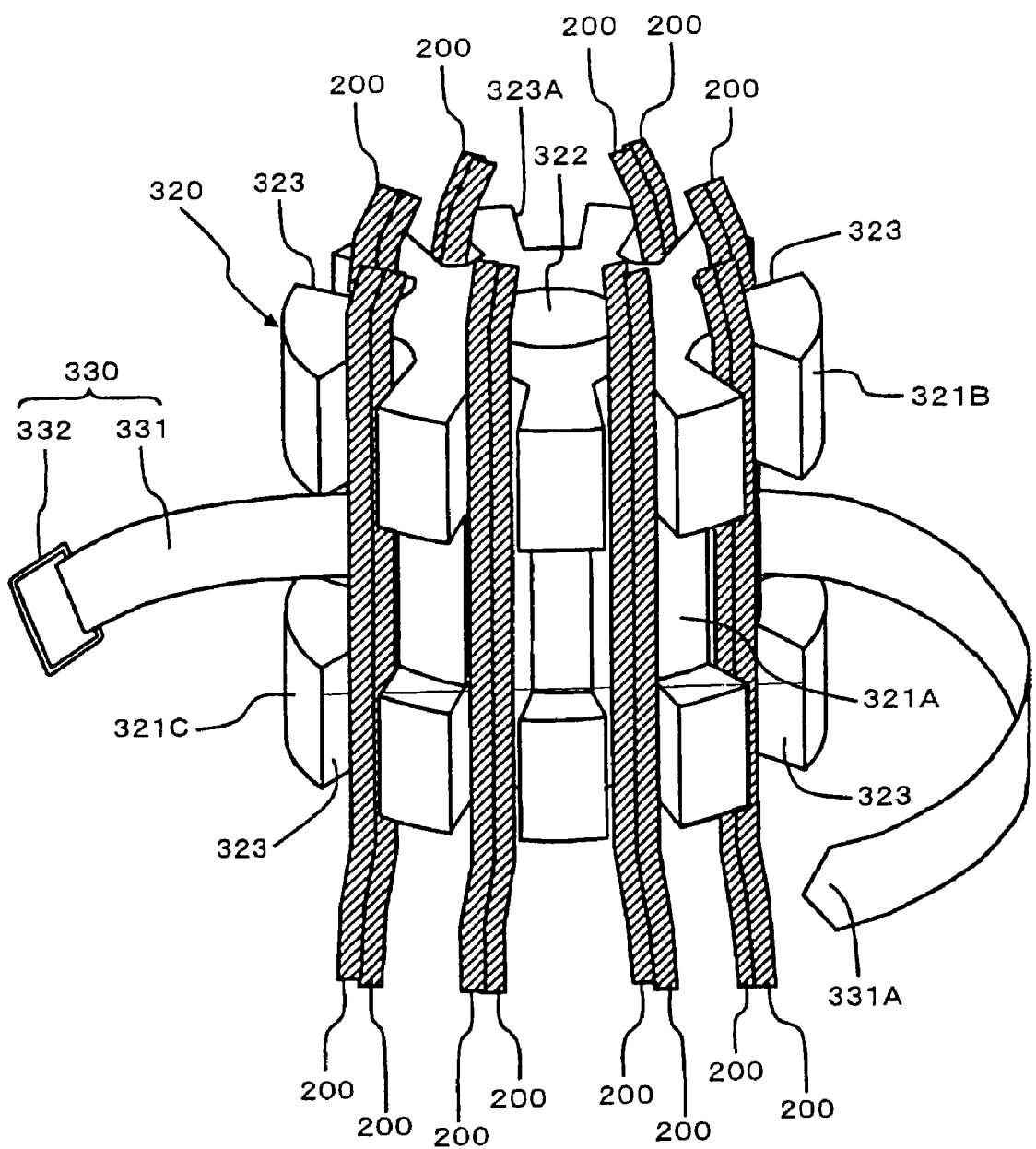
FIG. 12 is an oblique view showing a state wherein a fixing band is wrapped around a clamp core.
Figure 13:
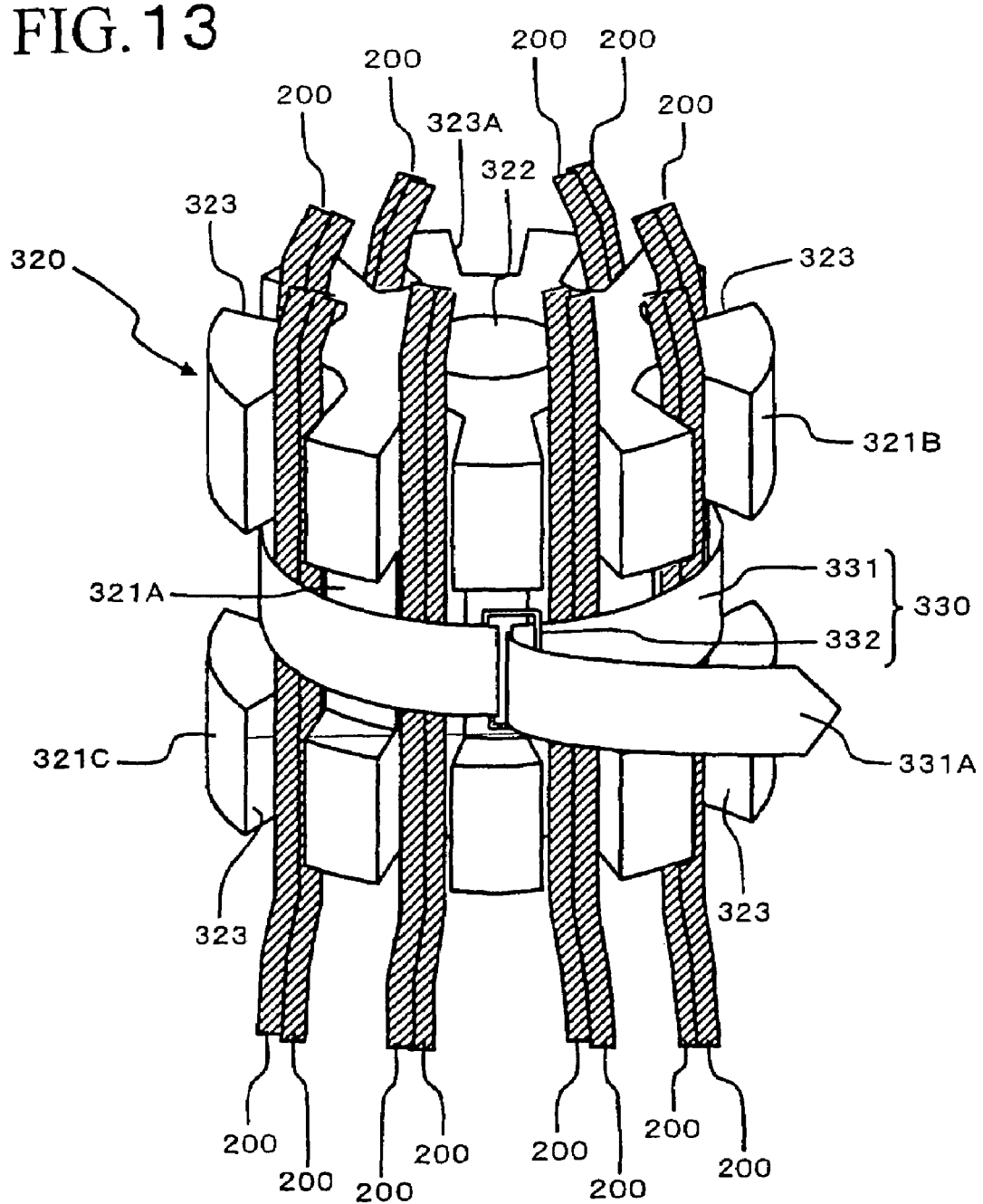
FIG. 13 is an oblique view showing a state wherein groups of cables are clamped by wrapping a fixing band around a cable core.

A fixing band 330 is disposed from the periphery of the shank portion 321A of a core main body 321 so as to cover the respective cables 200. The method of attaching a fixing band 330 will be explained by referring to FIG. 12 and FIG. 13. Fixing band 330 can be constituted from a band main body 331 and an attaching portion 332 disposed on one end of the band main body 331. As shown in FIG. 12, subsequent to passing two cables 200 each through the respective slots 323, a fixing band 330 is wrapped around the core main body 321 from the outside. Then, as shown in FIG. 13, the tip 331A of the band main body 331 is passed through the attaching portion 332, tightened to an appropriate load, and the surplus tip portion is disposed of so that the fixing band 330 does not fall off of its own accord. By wrapping a fixing band 330 around the outside of the shank portion 321A like this, it is possible to retain the cables 200 that have been passed through the respective slots 323. The fixing band 330 can be readily attached, and since it can also be easily removed, the task of replacing cables 200 can be performed easily.

Here, the tightening force resulting from the fixing band 330 is set such that the cables 200 do not come out of the connecters 122 even when a predetermined downward tensile force (for example, approximately 160N) is applied to the cables 200 clamped in the clamp core 320. Furthermore, when a load in excess of the prescribed tensile force acts on the cables 200, the cables 200 are designed to break part way along their length to prevent the connectors 122 from breaking.

Figure 14A:
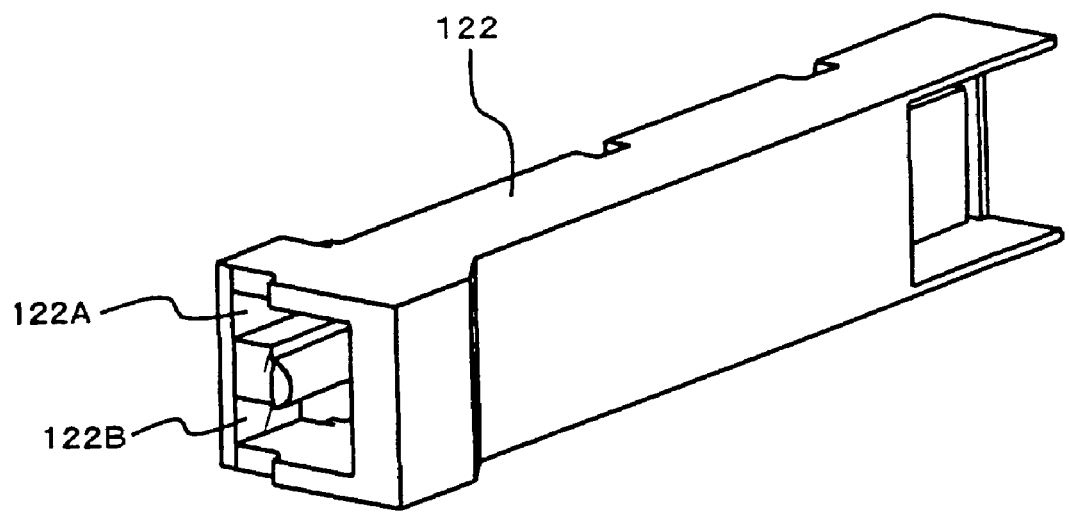
FIG. 14 is a schematic diagram showing examples of a connector and a cable, wherein (a) shows the external shape of a connector, and (b) shows the connection relationship between a connector and a cable, respectively.
Figure 14B:
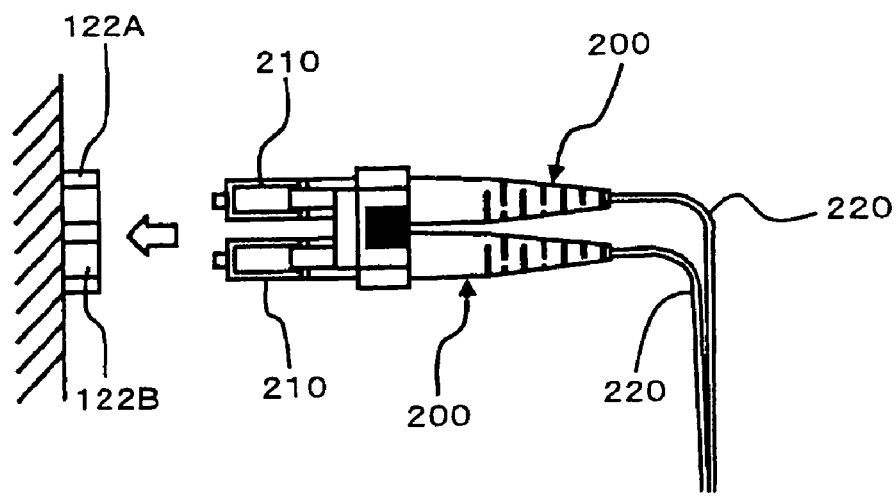
Figure 15:
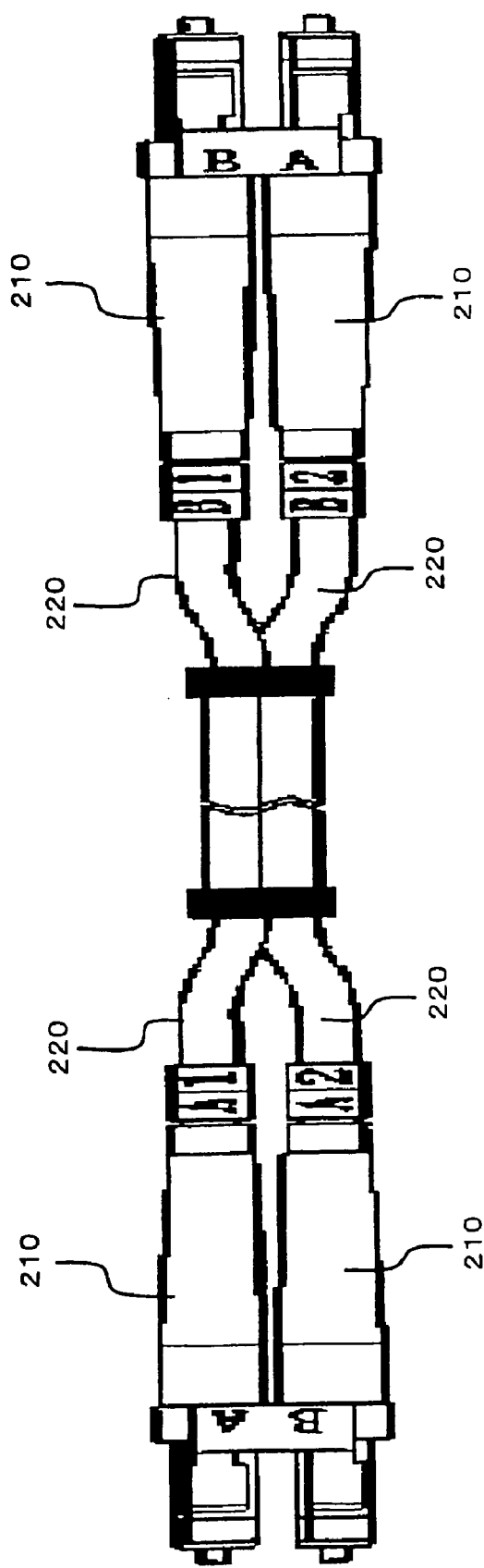
FIG. 15 is a plan view showing an example of a cable.

Furthermore, FIG. 14(a) is an oblique view showing an example of the shape of a connector 122. FIG. 14(b) is a schematic view showing the state wherein cables 200 are being connected to a connector 122. FIG. 15 is a plan view showing an example of cables 200 in which two cables constitute one pair. FIG. 16 is projection views of a cable 200. As shown in FIGS. 14 through 16, a pair of cables can be constituted by integrally forming connectors 210 at both ends of two cables 200. Furthermore, the cable constitution is not limited thereto, and can also be a plurality of cables in which each is physically separated.

Since this embodiment has the above-described constitution, it exhibits the following effect. This embodiment is constituted such that the cable clamping mechanism 300 holds the cables 200 part way along their length with a predetermined clamping force. Consequently, even when an excessive tensile force acts on the cables 200, it is possible to prevent the connectors 122 from being damaged by this tensile force acting directly on the connectors 122. In this case, there is the possibility that the cables 200 will break due to the excessive tensile force, but replacing the cables 200 instead of replacing the entire control package 100 reduces maintenance costs.

In this embodiment, the cable clamping mechanism 300 is constituted to gather together and clamp the cables 200 for each control package 100. Therefore, even when there are a large number of cables 200, the groups of cables can be readily identified, making maintenance work easier. For example, when eight pairs of cables 200 are respectively connected to a total of eight control packages 100 on one side of the basic chassis 11, 8×2×8=126 cables 200 are connected. There are a total of 256 cables 200 on the two sides of the basic chassis 11. In this embodiment, even when a large number of cables 200 is connected like this, since the cables 200 connected to a single control package 100 are collected together and clamped by a single clamp core 320, it is possible to easily identify which groups of cables are connected to which control packages 100.

Each clamp core 320 in this embodiment is constituted so as to be capable of moving in the direction in which the control packages 100 are arranged (coinciding with the arrangement direction of other replaceable functional components, such as the power units 400 and battery units 500). Further, the mounting location of the rail portion 310 is selected so as not to interfere with the attachment and detachment of other functional components. Therefore, for example, when replacing a functional component (control package 100) to which cables 200 are connected, and other functional components (power unit 400, battery unit 500) that are arranged on the underside of this functional component, like the control package 100, power unit 400 and battery unit 500, replacement work can be carried out by simply moving the group of cables slightly in the horizontal direction as-is without removing the control packages 100, thereby enhancing maintainability.

The cables 200 of this embodiment are constituted so as to hang down as-is from the connecting face of a control package 100. Consequently, compared to cables that are made to hang down after being guided to the inside of the basic chassis 11, useless slack in the cable can be done away with, making it possible to prevent signal degradation, and enhance the performance of the cables 200.

A clamp core 320 of this embodiment is constituted so as to form an approximately cylindrical or approximately cylindrical shape, and to clamp each cable 200 at equal intervals in the circumferential direction of the clamp core 320. Therefore, a clamp core 320 can be compactly formed, and each cable 200 can be clamped with an approximately uniform force by the fixing band 330. For example, a clamp core could also be formed into a rectangular shape, but this would make it difficult to make the clamping force uniform since the tightening force would become stronger at the corner portions of the rectangle, and the tightening force would become weaker at portions other than these corners.

Because a clamp core 320 of this embodiment compactly clamps a group of cables connected to a single control package 100, a plurality of cable groups can be mounted in a relatively small mounting space even when the disk array device 10 has a large number of external interfaces.

Furthermore, the present invention is not limited to the aspects of the embodiment described hereinabove. A person skilled in the art can make a variety of additions and changes within the scope of the present invention.

What is claimed is:

1. A disk array device, comprising:
   a chassis;
   a plurality of logic boards, which are detachably mounted on said chassis, and which connect respectively to a plurality of external devices via a plurality of cables, said logic boards including a channel adapter, a cache memory adapter and a disk adapter, said channel adapter transferring data sent from a host computer via at least one of said cables to said cache memory adapter, said cache memory adapter temporarily storing data transferred from said channel adapter, and said disk adapter transferring data stored in said cache memory adapter to a plurality of disk drives; and
   a plurality of movable cable supporting portions, which are movably disposed on a rail portion of said chassis, and which detachably support said cables in said logic boards,
   wherein said movable cable supporting portions comprise an approximately cylindrical main body, a mounting portion for movably mounting said main body to said rail portion, and a plurality of slots on the main body,
   wherein the plurality of slots are spaced around the periphery of the main body, and
   wherein said cables are respectively accommodated in said slots and are vertically aligned within said slots.

2. The disk array device according to claim 1, wherein said plurality of slots accommodate a plurality of kinds of cables, the external dimensions of which differ respectively.

3. The disk array device according to claim 2, further comprising:
   a fixing portion for fixing said cables, which are respectively accommodated in said slots.

4. The disk array device according to claim 1, wherein said cables accommodated in said plurality of slots are connected to the same logic board respectively.

5. The disk array device according to claim 4 further comprising: a
   fixing portion for fixing said cables, which are respectively accommodated in said slots.

6. The disk array device according to claim 1, further comprising:
   a fixing portion for fixing said cables, which are respectively accommodated in said slots.

7. The disk array device according to claim 1, wherein, of said cables, the cables which are connected to lowermost ends of said logic boards are connected to said logic boards respectively such that a preset, predetermined allowable bending radius can be maintained.

8. The disk array device according to claim 1, wherein said rail portion is disposed on said chassis parallel to the direction in which said logic boards are arranged.

9. The disk array device according to claim 8, wherein said rail portion is positioned in the vicinity of the underside of said logic boards, and is disposed so as not to interfere with the attachment and detachment of other members.

10. The disk array device according to claim 1, wherein said plurality of movable cable supporting portions are movably disposed on said rail portion in accordance with the number of said logic boards.

11. The disk array device according to claim 1, further comprising:
    a plurality of through-holes disposed in a lower part of said chassis for passing said cables through to the lower part of said chassis, wherein said through-holes allow said cables to move in accordance with the movement of said movable cable supporting portions.

12. The disk array device according to claim 11, wherein said through-holes variably adjust an opening area of said through holes in accordance with the amount of movement of said cables.

13. The disk array device according to claim 1, further comprising:
    a fixing portion for fixing said cables, said fixing portion comprising a band having a first end and a second end, and having an attaching portion disposed on the second end of the band,
    wherein said band is wrapped around the main body, so as to cover the cables, and
    wherein the first end of the band is passed through the attaching portion at the second end of the band.

14. A disk array device, comprising:
    a chassis;
    a door portion, which covers an opening face in said chassis in a freely opening and closing condition;
    a plurality of channel adapter boards, which are detachably mounted on the approximately middle portion of said chassis in the vertical direction, and a connecting face with a host device is positioned more on the inner side than at the opening face in said chassis, said channel adapter boards including a channel adapter, a cache memory adapter and a disk adapter, said channel adapter transferring data sent from a host computer via at least one of said cables to said cache memory adapter, said cache memory adapter temporarily storing data transferred from said channel adapter, and said disk adapter transferring data stored in said cache memory adapter to a plurality of disk drives;
    a plurality of cables, first ends of which are connected to said connecting faces of said channel adapter boards, and second ends of which are connected to said host device;
    at least one kind of functional component, which is positioned on an underside of said channel adapter boards, and detachably mounted on said chassis; and
    a plurality of movable cable supporting portions, which are movably disposed on a rail portion of said chassis in accordance with the number of said channel adapter boards, and which support said cables in a detachable condition in units of said channel adapter boards,
    wherein each said movable cable supporting portion comprises:
    an approximately cylindrical main body,
    a plurality of slots, which are spaced around the periohery of the main body, and which house either one or a plurality of a plurality of types of cables, each having different external dimensions, and said cables being vertically aligned within said slots, a mounting portion for movably mounting said main body on said rail portion in a non-rotatable state, and a fixing portion that fixes said cables accommodated in said respective slots by being wrapped around the outer side of said main body.

15. The disk array device according to claim 14, wherein said rail portion is positioned more on the underside than in the mounting locations of said channel adapter boards so as not to interfere with the attaching and detaching of said at least one functional component, and is disposed on said chassis parallel to the direction in which said channel adapter boards are arranged.

16. The disk array device according to claim 14, wherein said plurality of movable cable supporting portions are movably disposed on said rail portion in accordance with the number of said channel adapter boards.

17. The disk array device according to claim 14, further comprising:

a plurality of through-holes, which are disposed on a lower part of said chassis for allowing said cables supported by said movable cable supporting portions to pass through, and which enable said cables to move in accordance with the movement of said movable cable supporting portions.

18. The disk array device according to claim 14, wherein the fixing portion comprises a band having a first end and a second end, and having an attaching portion disposed on the second end of the band, wherein said band is wrapped around the main body, so as to cover the cables, and wherein the first end of the band is passed through the attaching portion at the second end of the band.

19. A disk array device, comprising:

a chassis;

a plurality of logic boards, which are detachably mounted on said chassis, and which connect respectively to a plurality of external devices via a plurality of cables, said logic boards including a channel adapter, a cache memory adapter and a disk adapter, said channel adapter transferring data sent from a host computer via at least one of said cables to said cache memory adapter, said cache memory adapter temporarily storing data transferred from said channel adapter, and said disk adapter transferring data stored in said cache memory adapter to a plurality of disk drives;

a plurality of movable cable supporting portions, which are movably disposed on a rail portion of said chassis, and which detachably support said cables in said logic boards, wherein said plurality of movable cable supporting portions comprise a plurality of slots that accommodate a plurality of kinds of cables, the external dimensions of which differ respectively, said cables being vertically aligned within said slots; and a fixing portion for fixing said cables, which are respectively accommodated in said slots.

20. The disk array device according to claim 19, wherein said rail portion is disposed on said chassis parallel to the direction in which said logic boards are arranged.

21. The disk array device according to claim 19, wherein said plurality of movable cable supporting portions are movably disposed on said rail portion in accordance with the number of said logic boards.

22. The disk array device according to claim 19, further comprising:

a plurality of through-holes disposed in a lower part of said chassis for passing said cables through to the lower part of said chassis, wherein said through-holes allow said cables to move in accordance with the movement of said movable cable supporting portions.

23. The disk array device according to claim 19, wherein the fixing portion comprises a band having a first end and a second end, and having an attaching portion disposed on the second end of the band, wherein said band is wrapped around the main body, so as to cover the cables, and wherein the first end of the band is passed through the attaching portion at the second end of the band.

* * * * *